United States Patent
Omoto et al.

(10) Patent No.: US 8,520,767 B2
(45) Date of Patent: Aug. 27, 2013

(54) TRANSMISSION CIRCUIT AND COMMUNICATION APPARATUS USING POLAR MODULATION METHOD

(75) Inventors: Yukihiro Omoto, Nara (JP); Shigeru Morimoto, Osaka (JP)

(73) Assignee: Panasonic Corporation, Osaka (JP)

( * ) Notice: Subject to any disclaimer, the term of this patent is extended or adjusted under 35 U.S.C. 154(b) by 43 days.

(21) Appl. No.: 13/265,383

(22) PCT Filed: Dec. 28, 2010

(86) PCT No.: PCT/JP2010/007608
§ 371 (c)(1),
(2), (4) Date: Oct. 20, 2011

(87) PCT Pub. No.: WO2011/108057
PCT Pub. Date: Sep. 9, 2011

(65) Prior Publication Data
US 2012/0189081 A1    Jul. 26, 2012

(30) Foreign Application Priority Data
Mar. 5, 2010 (JP) .................. 2010-049604

(51) Int. Cl.
*H04L 27/00* (2006.01)

(52) U.S. Cl.
USPC ........... 375/295; 375/298; 375/300; 375/302; 375/296; 455/126; 455/127.1; 455/114.2; 455/125; 455/114.3; 370/278; 330/136; 330/149; 330/151

(58) Field of Classification Search
USPC ..... 330/1–207; 370/200–546; 375/130–240, 375/241–377; 455/1–899
See application file for complete search history.

(56) References Cited

U.S. PATENT DOCUMENTS

| | | | | |
|---|---|---|---|---|
| 5,023,684 A | * | 6/1991 | Tsunoda | 257/423 |
| 6,366,177 B1 | * | 4/2002 | McCune et al. | 332/103 |
| 7,035,611 B2 | * | 4/2006 | Garlepp et al. | 455/269 |

(Continued)

FOREIGN PATENT DOCUMENTS

| | | |
|---|---|---|
| JP | 2002-353744 | 12/2002 |
| JP | 2005-57665 | 3/2005 |

(Continued)

OTHER PUBLICATIONS

International Search Report issued Mar. 22, 2011 in corresponding International Application No. PCT/JP2010/007608.

*Primary Examiner* — Daniel Washburn
*Assistant Examiner* — Amneet Singh
(74) *Attorney, Agent, or Firm* — Wenderoth, Lind & Ponack, L.L.P.

(57) ABSTRACT

A transmission circuit adjust a difference between signal delay amounts in an amplitude path and a phase path with a low power consumption. An amplitude modulation section amplitude-modulates a phase modulation signal outputted from a phase modulation section with a voltage control signal provided by a regulator to generate a transmission signal for an output of an antenna. Similarly, a feedback signal generation section amplitude-modulates the phase modulation signal with a voltage control signal to generate a feedback signal. The signal is fed back to a delay adjustments sections used for calculating and adjusting the difference between the signal delay amounts in the amplitude path and the phase path. The feedback signal generation section is attained by a power amplifier having the same configuration as the amplitude modulation section and a smaller circuit scale.

8 Claims, 7 Drawing Sheets

(56) References Cited

U.S. PATENT DOCUMENTS

| | | | |
|---|---|---|---|
| 7,333,780 B2 * | 2/2008 | Udagawa et al. | 455/126 |
| 7,379,715 B2 * | 5/2008 | Udagawa et al. | 455/126 |
| 7,508,267 B1 * | 3/2009 | Yu et al. | 330/286 |
| 7,573,949 B2 * | 8/2009 | Matsuura et al. | 375/295 |
| 7,688,156 B2 * | 3/2010 | Matsuura et al. | 332/145 |
| 7,791,907 B2 * | 9/2010 | Cho et al. | 363/21.01 |
| 8,284,581 B2 * | 10/2012 | Ivanov | 363/127 |
| 2002/0090920 A1 * | 7/2002 | McCune | 455/110 |
| 2002/0141510 A1 * | 10/2002 | Sridharan et al. | 375/300 |
| 2006/0057976 A1 | 3/2006 | Klemmer | |
| 2006/0159198 A1 * | 7/2006 | Morimoto et al. | 375/297 |
| 2006/0234652 A1 * | 10/2006 | Oka | 455/102 |
| 2006/0245517 A1 * | 11/2006 | Ikedo et al. | 375/297 |
| 2006/0246856 A1 | 11/2006 | Udagawa et al. | |
| 2007/0184793 A1 * | 8/2007 | Drogi et al. | 455/127.1 |
| 2007/0184795 A1 * | 8/2007 | Drogi et al. | 455/127.1 |
| 2007/0184796 A1 * | 8/2007 | Drogi et al. | 455/127.1 |
| 2007/0229180 A1 * | 10/2007 | Shimizu et al. | 332/103 |
| 2008/0246550 A1 * | 10/2008 | Biedka et al. | 332/145 |
| 2008/0282802 A1 * | 11/2008 | Pike et al. | 73/514.32 |
| 2009/0011723 A1 * | 1/2009 | Inamori et al. | 455/102 |
| 2009/0275359 A1 * | 11/2009 | Puma et al. | 455/550.1 |
| 2010/0027445 A1 | 2/2010 | Matsuura | |
| 2010/0091828 A1 * | 4/2010 | Mayer et al. | 375/226 |
| 2010/0189193 A1 * | 7/2010 | Miura | 375/308 |

FOREIGN PATENT DOCUMENTS

| | | |
|---|---|---|
| JP | 2005-210549 | 8/2005 |
| JP | 2008-514044 | 5/2008 |
| JP | 2009-194575 | 8/2009 |
| JP | 2010-41232 | 2/2010 |

* cited by examiner

TRANSMISSION CIRCUIT AND COMMUNICATION APPARATUS USING POLAR MODULATION METHOD

BACKGROUND OF THE INVENTION

1. Technical Field

The present invention relates to a transmission circuit using a polar modulation method which is used in a wireless communication system such as a mobile phone, a wireless LAN, and the like, and more particularly, to a transmission circuit which adjusts a difference between a signal delay amount in an amplitude path and a signal delay amount in a phase path in a polar modulation method and a communication apparatus using the transmission circuit.

2. Background Art

Recently, as a transmission circuit which operates highly efficiently, there has been an increasing interest in a transmission circuit using a polar modulation method. In the polar modulation method, an input signal is separated into a phase signal representing a phase component and an amplitude signal representing an amplitude component, and processed. The separated phase signal is multiplied by an oscillation signal generated by an oscillator to obtain a phase signal having a constant amplitude, that is, a phase modulation signal. The phase modulation signal is synthesized with the separated amplitude signal by using a saturation amplifier and outputted as a transmission signal.

In the polar modulation method, a phase signal and an amplitude signal are separately processed. Accordingly, when a phase modulation signal is synthesized with an amplitude signal, the saturation amplifier can be operated in a saturation region, thereby allowing generation of a transmission signal with high power efficiency.

At the same time, in the polar modulation method, because the phase signal and the amplitude signal are separately processed, if there is a difference between an amount of signal delay in an amplitude path (a path in which the separated amplitude signal is processed) and an amount of signal delay in a phase path (a path in which the separated phase signal is processed), the spectrum of the transmission signal obtained by synthesizing the phase modulation signal with the amplitude signal spreads, resulting in deterioration of adjacent channel interference characteristics. Consequently, in the polar modulation method, a difference between a signal delay amount in the amplitude path and a signal delay amount in the phase path needs to be adjusted.

Therefore, a conventional transmission circuit using the polar modulation method outputs a transmission signal and returns a part of the transmission signal as a feedback signal. The conventional transmission circuit using the polar modulation method calculates a difference between a signal delay amount in the amplitude path and a signal delay amount in the phase path based on the input signal and the feedback signal, and adjusts the difference (for example, see Patent Literature 1 and Patent Literature 2).

FIG. 6 shows a configuration example of a transmission circuit using a conventional polar modulation method, which adjusts a difference between signal delay amounts by using feedback control. In FIG. 6, a conventional transmission circuit 100 includes a signal generation section 101, a delay adjustment section 102, a regulator 103, a phase modulation section 104, an amplitude modulation section 105, and a coupler 106.

The signal generation section 101 processes an input signal and thereby generates an amplitude signal R and a phase signal θ. Based on the amplitude signal R and the phase signal θ generated by the signal generation section 101, and a feedback signal FB fed back from the coupler 106, the delay adjustment section 102 calculates a difference between a signal delay amount in the amplitude path and a signal delay amount in the phase path. Then, the delay adjustment section 102 controls an output timing of the amplitude signal R or the phase signal θ so that the difference between the signal delay amounts is eliminated. An amplitude signal R' and a phase signal θ' outputted from the delay adjustment section 102 are inputted to the regulator 103 and the phase modulation section 104, respectively. The regulator 103 provides the amplitude modulation section 105 with a voltage control signal in accordance with the inputted amplitude signal R'. By using the inputted phase signal θ', the phase modulation section 104 modulates an oscillation signal generated by an oscillator (not shown) to generate a phase modulation signal. The amplitude modulation section 105 is typically a power amplifier (PA), and amplitude-modulates the phase modulation signal outputted from the phase modulation section 104 by the voltage control signal provided by the regulator 103 to generate a modulation signal and outputs the modulation signal as a transmission signal. The coupler 106 divides the transmission signal into two signals, which are an output signal and a feedback signal. The output signal is transmitted in the air via an antenna (not shown). Further, the feedback signal FB is inputted to the delay adjustment section 102 and used for calculating a difference between a signal delay in the amplitude path and a signal delay in the phase path.

With the above configuration, in the conventional transmission circuit 100, a difference between a signal delay amount in the amplitude path and a signal delay amount in the phase path can be adjusted. However, in the conventional transmission circuit 100, a problem remains that a power loss caused by the coupler 106 is large, resulting in decrease in power efficiency of the entire circuit.

In order to solve the problem, there has been proposed a technology to adjust a difference between signal delay amounts without using a coupler (for example, see Patent Literature 3). FIG. 7 shows a configuration example of a transmission circuit using a conventional polar modulation method without a coupler. In FIG. 7, a conventional transmission circuit 200 includes the signal generation section 101, a delay adjustment section 202, the regulator 103, the phase modulation section 104, and the amplitude modulation section 105.

The signal generation section 101 processes an input signal, and thereby generates an amplitude signal R and a phase signal θ. The amplitude signal R is inputted to the regulator 103 and the delay adjustment section 202, and the phase signal θ is inputted to the delay adjustment section 202. The regulator 103 provides the amplitude modulation section 105 with a voltage control signal in accordance with the inputted amplitude signal R. The delay adjustment section 202 receives the amplitude signal R and the phase signal θ generated by the signal generation section 101, and the voltage control signal provided by the regulator 103. Then, the delay adjustment section 202 obtains an amount of signal delay in the amplitude path based on the amplitude signal R and the voltage control signal, and controls an output timing of the phase signal θ based on the amount of signal delay. By using the adjusted phase signal θ' outputted from the delay adjustment section 202, the phase modulation section 104 modulates an oscillation signal generated by an oscillator (not shown) to generate a phase modulation signal. The amplitude modulation section 105 amplitude-modulates the phase modulation signal outputted from the phase modulation section 104 by the voltage control signal provided by the regulator 103 to generate a modulation signal and outputs the modulation signal as a transmission signal.

With the above configuration, in the conventional transmission circuit 200, a difference between a signal delay amount in the amplitude path and a signal delay amount in the phase path can be adjusted without power loss by a coupler

CITATION LIST

[Patent Literature]
 [Patent Literature 1] Japanese Patent No. 3844352
 [Patent Literature 2] Japanese Laid-Open Patent Publication No. 2009-194575
 [Patent Literature 3] Japanese Laid-Open Patent Publication No. 2008-514044

SUMMARY OF THE INVENTION

However, in the conventional transmission circuit 200, signal delay amounts are calculated by using only information of the amplitude path, and thus there is a problem that estimation precision for a relative difference between a signal delay amount of the amplitude path and a signal delay amount of the phase path is low. The problem is prominent because the wider the bandwidth of a modulation signal is, the larger the delay in the phase path becomes, which affects the performance of the transmission circuit.

Moreover, in the conventional transmission circuit 200, only the information of the amplitude path is used, and thus it is difficult to compensate distortion caused by the nonlinearity of the amplitude modulation section 105.

Therefore, an object of the present invention is to provide a transmission circuit and a communication apparatus using a polar modulation method which can, by means of a low power consumption without using a coupler that causes a large power loss, adjust a difference between a signal delay amount in the amplitude path and a signal delay amount in the phase path and compensate nonlinear distortion caused in a power amplifier.

The present invention is directed to a transmission circuit using a polar modulation method. In order to achieve the above object, the transmission circuit of the present invention includes a signal generation section, a delay adjustment section, a phase modulation section, a regulator, an amplitude modulation section, and a feedback signal generation section.

The signal generation section processes an input signal and thereby generates an amplitude signal representing an amplitude component and a phase signal representing a phase component. The delay adjustment section: calculates a difference between a signal delay amount in an amplitude path and a signal delay amount in a phase path based on the amplitude signal, the phase signal, and a feedback signal; and adjusts, in accordance with the difference, one of or both of the signal delay amount in the amplitude signal and the signal delay amount in the phase signal. The phase modulation section modulates a predetermined carrier signal by the adjusted phase signal adjusted by the delay adjustment section and thereby generates a phase modulation signal. The regulator outputs a voltage control signal in accordance with a magnitude of the adjusted amplitude signal adjusted by the delay adjustment section. The amplitude modulation section modulates the phase modulation signal by the voltage control signal and outputs the modulated signal to an antenna as a transmission signal. The feedback signal generation section modulates the phase modulation signal by the voltage control signal and feeds back the modulated signal to the delay adjustment section as the feedback signal. The feedback signal generation section has a circuit scale which is smaller than a circuit scale of the amplitude modulation section.

Alternatively, a distortion compensation section may be further included, which: calculates an amount of nonlinear distortion caused in the amplitude modulation section based on the adjusted amplitude signal, the adjusted phase signal and the feedback signal; and controls, in accordance with the amount, output of the adjusted amplitude signal and the adjusted phase signal and thereby compensates the nonlinear distortion.

It should be noted that it is preferable that the amplitude modulation section and the feedback signal generation section are mounted on the same semiconductor substrate so as to be adjacent to each other.

Furthermore, the present invention is directed to a communication apparatus including the transmission circuit described above. The communication apparatus includes any transmission circuit described above which generates a transmission signal and an antenna which outputs the transmission signal generated by the transmission circuit. Alternatively, the communication apparatus may further includes: a reception circuit which processes a reception signal received from the antenna; and an antenna duplexer which outputs the transmission signal generated by the transmission circuit to the antenna, and outputs the reception signal received from the antenna to the reception circuit.

According to the present invention, it is possible, by means of a low power consumption without using a coupler that causes a large power loss, to adjust a difference between a signal delay amount in the amplitude path and a signal delay amount in the phase path and compensate nonlinear distortion caused in a power amplifier.

DETAILED DESCRIPTION OF INVENTION

In the following, embodiments of the present invention will be described with reference to the drawings.

<First Embodiment>

Figure 1:
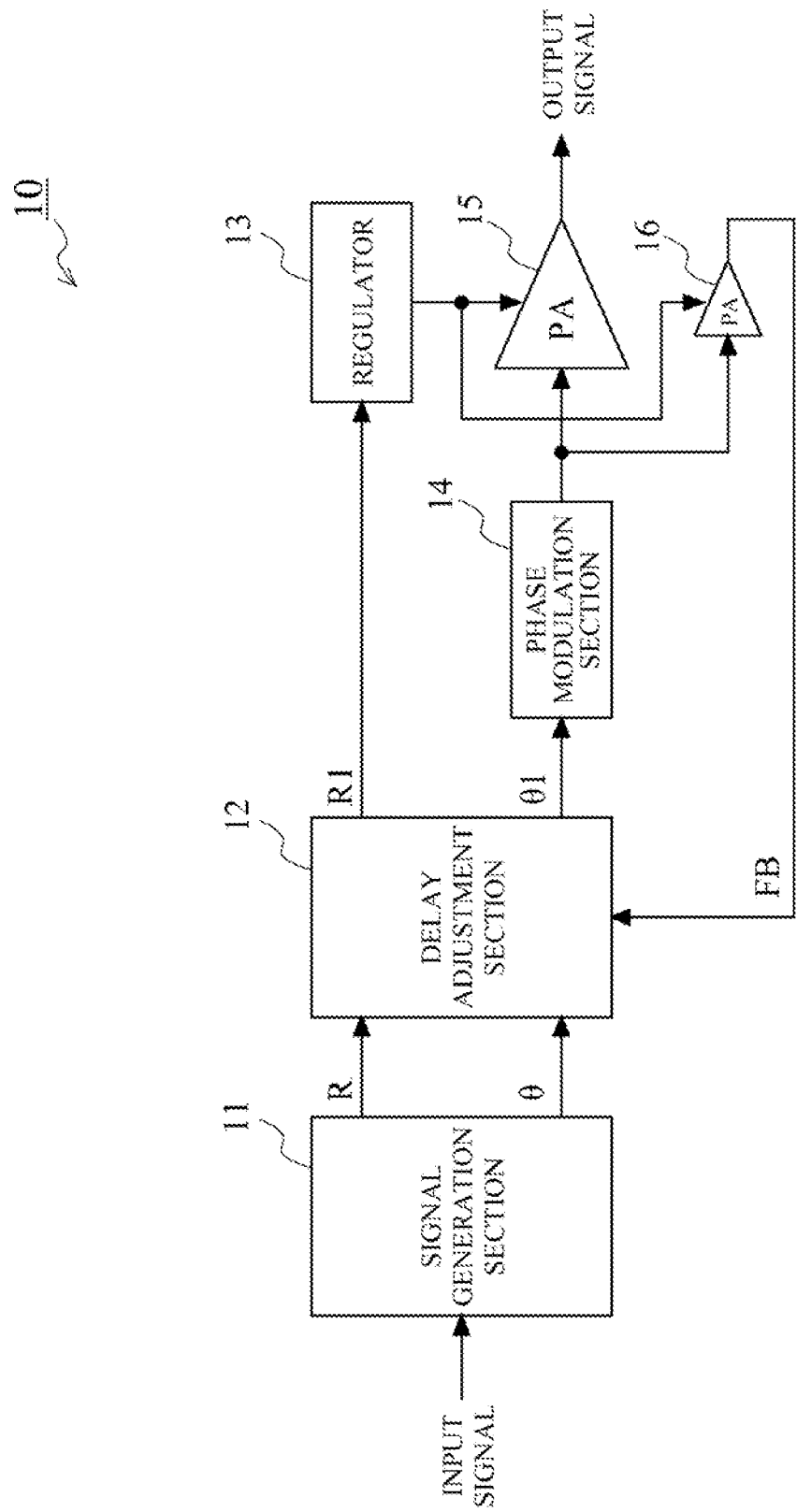
FIG. 1 shows a configuration of a transmission circuit 10 according to a first embodiment of the present invention.

FIG. 1 shows a configuration of a transmission circuit 10 according to a first embodiment of the present invention. In FIG. 1, the transmission circuit 10 of the first embodiment includes a signal generation section 11, a delay adjustment section 12, a regulator 13, a phase modulation section 14, an amplitude modulation section 15, and a feedback signal generation section 16.

The signal generation section 11 processes an input signal and thereby generates an amplitude signal R representing an amplitude component and a phase signal θ representing a phase component. The delay adjustment section 12 calculates a difference between a signal delay amount in the amplitude path and a signal delay amount in the phase path based on the amplitude signal R and the phase signal θ generated by the signal generation section 11, and a feedback signal FB outputted from the feedback signal generation section 16. Then, the delay adjustment section 12 adjusts one of or both of an output timing of the amplitude signal R and an output timing of the phase signal θ, that is, the delay adjustment section 12 adjusts signal delay amounts so that the calculated difference of the signal delay amounts is eliminated, and outputs the resultant signals as an adjusted amplitude signal R1 and an adjusted phase signal θ1, respectively. The adjusted amplitude signal R1 and the adjusted phase signal θ1 outputted from the delay adjustment section 12 are inputted to the regulator 13 and the phase modulation section 14, respectively. The regulator 13 generates a voltage control signal in accordance with the inputted adjusted amplitude signal R1 and provides the voltage control signal to the amplitude modulation section 15 and the feedback signal generation section 16. As the regulator 13, a switching regulator or a series regulator is used. The phase modulation section 14 modulates a predetermined carrier signal which is oscillated by an oscillator (not shown) by using the inputted adjusted phase signal θ1 to generate a phase modulation signal.

The amplitude modulation section 15 amplitude-modulates the phase modulation signal outputted from the phase modulation section 14 by the voltage control signal provided by the regulator 13 to generate a phase-amplitude modulation signal. The phase-amplitude modulation signal is transmitted into the air via an antenna (not shown) as an output signal. Similarly, the feedback signal generation section 16 amplitude-modulates the phase modulation signal outputted from the phase modulation section 14 by the voltage control signal provided by the regulator 13 to generate a phase-amplitude modulation signal. The phase-amplitude modulation signal is fed back to the delay adjustment section 12 as a feedback signal FB and used for calculating and adjusting a difference between a signal delay amount in the amplitude path and a signal delay amount in the phase path. As the amplitude modulation section 15 and the feedback signal generation section 16, power amplifiers (PA) are used.

The feature of the present invention is that the amplitude modulation section 15 and the feedback signal generation section 16 are attained by power amplifiers which have the same circuit configuration and different circuit scales. That is, the circuit scale (device area, and the like) of the feedback signal generation section 16 is made smaller than that of the amplitude modulation section 15 so that the feedback signal generation section 16 takes a role as the coupler described in the conventional technology.

Here, by using specific figures, an advantageous effect of decreased power consumption achieved by preventing power loss in the transmission circuit 10 of the present invention will be described. In the example below, a difference of heat loss between the configuration of the conventional transmission circuit 100 including the amplitude modulation section 105 and the coupler 106 and the configuration of the present invention including the amplitude modulation section 15 and the feedback signal generation section 16 will be considered. As a condition, the amplitude modulation section 105 operates at 26 dBm in the conventional transmission circuit 100 while 0.5 dBm is distributed by the coupler 106. In addition, the heat loss rate of the power amplifiers of the respective configurations is assumed to be 50%.

Based on the condition of the heat loss rate being 50%, the heat loss of the conventional transmission circuit 100 is $10^{(26/10)}=398$ mW which is the same as an output power of the amplitude modulation section 105.

Next, the heat loss of the transmission circuit 10 of the present invention will be considered. 0.5 dBm distributed by the coupler is unnecessary in the transmission circuit 10, and thus the amplitude modulation section 15 may be operated at 25.5 dBm (=26−0.5). Accordingly, the heat loss caused by the amplitude modulation section 15 is $10^{(25.5/10)}=354$ mW.

Meanwhile, the heat loss caused by the feedback signal generation section 16 is determined by the ratio of the circuit scale thereof to the circuit scale of the amplitude modulation section 15. For example, when the feedback signal generation section 16 is configured with 1/50 cells (1 cell is a minimum unit of a transistor that configures a power amplifier) of the amplitude modulation section 15, the heat loss caused by the feedback signal generation section 16 is 398/50=7.96 mW.

Therefore, the heat loss of the transmission circuit 10 of the present invention is 362 mW (=354+7.96) which is a sum of the heat loss caused by the amplitude modulation section 15 and the heat loss caused by the feedback signal generation section 16. When compared to the heat loss of the conventional transmission circuit 100, the heat loss of the transmission circuit 10 of the present invention can be suppressed to about 90.9% (=362/398*100), resulting in decrease in power consumption by about 9%.

It should be noted that, in the above specific example, the advantageous effect of decreased power consumption is described based on an assumption that the heat loss rate of the amplitude modulation section 15 is equal to the heat loss rate of the feedback signal generation section 16. However, in an actual circuit, the above heat loss rates are not necessarily equal to each other because they may vary due to matching and the like among the amplitude modulation section 15, the feedback signal generation section 16, and their peripheral circuits.

Furthermore, depending on the circuit scale of the feedback signal generation section 16, the heat loss caused by the transmission circuit 10 of the present invention may exceed the heat loss caused by the conventional transmission circuit 100. In the above specific example, this applies to a case where the feedback signal generation section 16 is configured so as to have a circuit scale of one-ninth cells of the amplitude modulation section 15 or larger. Accordingly, it is preferable that the circuit scale of the feedback signal generation section 16 is made smaller than the circuit scale of the amplitude modulation section 15 within a range that can exert the advantageous effect of decreased power consumption while taking variations of the heat loss rates, and the like fully into consideration.

Figure 2:
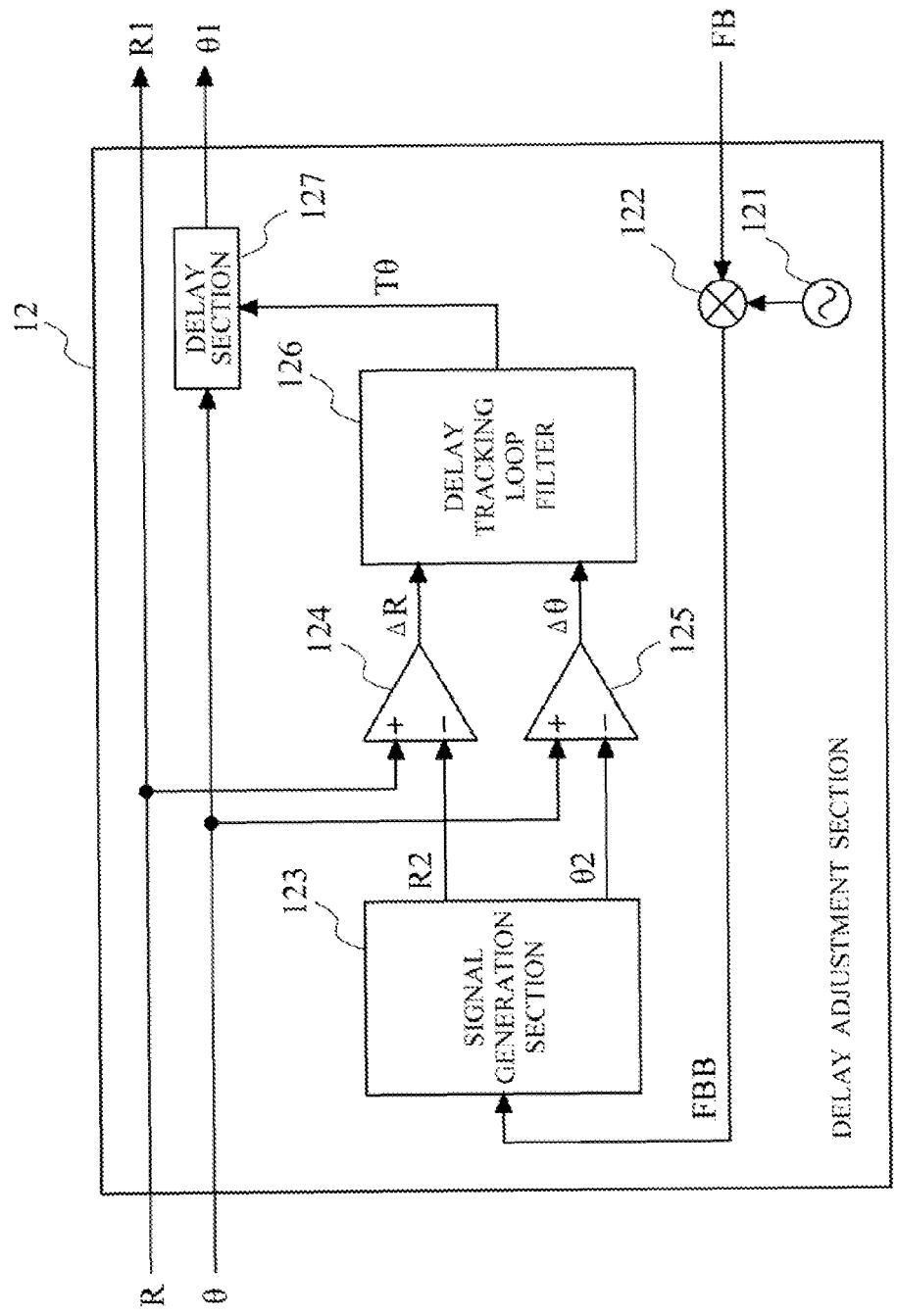
FIG. 2 shows a detailed configuration example of a delay adjustment section 12 of FIG. 1.

FIG. 2 shows a detailed configuration example of the delay adjustment section 12. The delay adjustment section 12 shown in FIG. 2 includes an oscillator 121, a mixer 122, a signal generation section 123, a magnitude comparator 124, a phase comparator 125, a delay tracking loop filter 126, and a delay section 127.

The mixer 122 multiplies a carrier frequency signal generated by the oscillator 121 by the feedback signal FB outputted from the feedback signal generation section 16 to generate a feedback baseband signal FBB. The signal generation section 123 processes the feedback baseband signal FBB and thereby generates a feedback amplitude signal R2 and a feedback phase signal θ2.

The magnitude comparator 124 compares the amplitude signal R generated by the signal generation section 11 with the feedback amplitude signal R2 generated by the signal generation section 123 and obtains a differential amplitude signal ΔR (=R−R2). The phase comparator 125 compares the phase signal θ generated by the signal generation section 11 with the feedback phase signal θ2 generated by the signal generation section 123 and obtains a differential phase signal Δθ (=θ−θ2).

The delay tracking loop filter 126 calculates a delay amount TO for converging a difference between the differential amplitude signal ΔR and the differential phase signal Δθ to zero. The delay section 127 delays the phase signal θ for the delay amount Tθ calculated by the delay tracking loop filter 126 and outputs the resultant signal as an adjusted phase signal θ1. Meanwhile, the amplitude signal R is outputted as an adjusted amplitude signal R1 without having adjusted the delay amount thereof.

It should be noted that, in the example of FIG. 2, only the delay amount of the phase signal θ is adjusted; however, the delay amount of the phase signal θ and the delay amount of the amplitude signal R may be simultaneously adjusted, or only the delay amount of the amplitude signal R may be adjusted.

As described above, in the transmission circuit 10 according to the first embodiment of the present invention, by using a feedback signal FB generated by the feedback signal generation section 16 attained by having the same circuit configuration as the amplitude modulation section 15 and a smaller circuit scale, a difference between a signal delay amount in the amplitude path and a signal delay amount in the phase path is adjusted. Consequently, a coupler is no longer necessary and there is no power loss caused by the coupler, and thus a transmission circuit using a polar modulation method, which can operate with a low power consumption as a whole circuit, can be attained.

<Second Embodiment>

In a second embodiment, description will be made on a transmission circuit which has an additional function of compensating nonlinear distortion of the amplitude modulation section 15 by making use of a feedback signal FB which includes not only amplitude information but also phase information.

Figure 3:
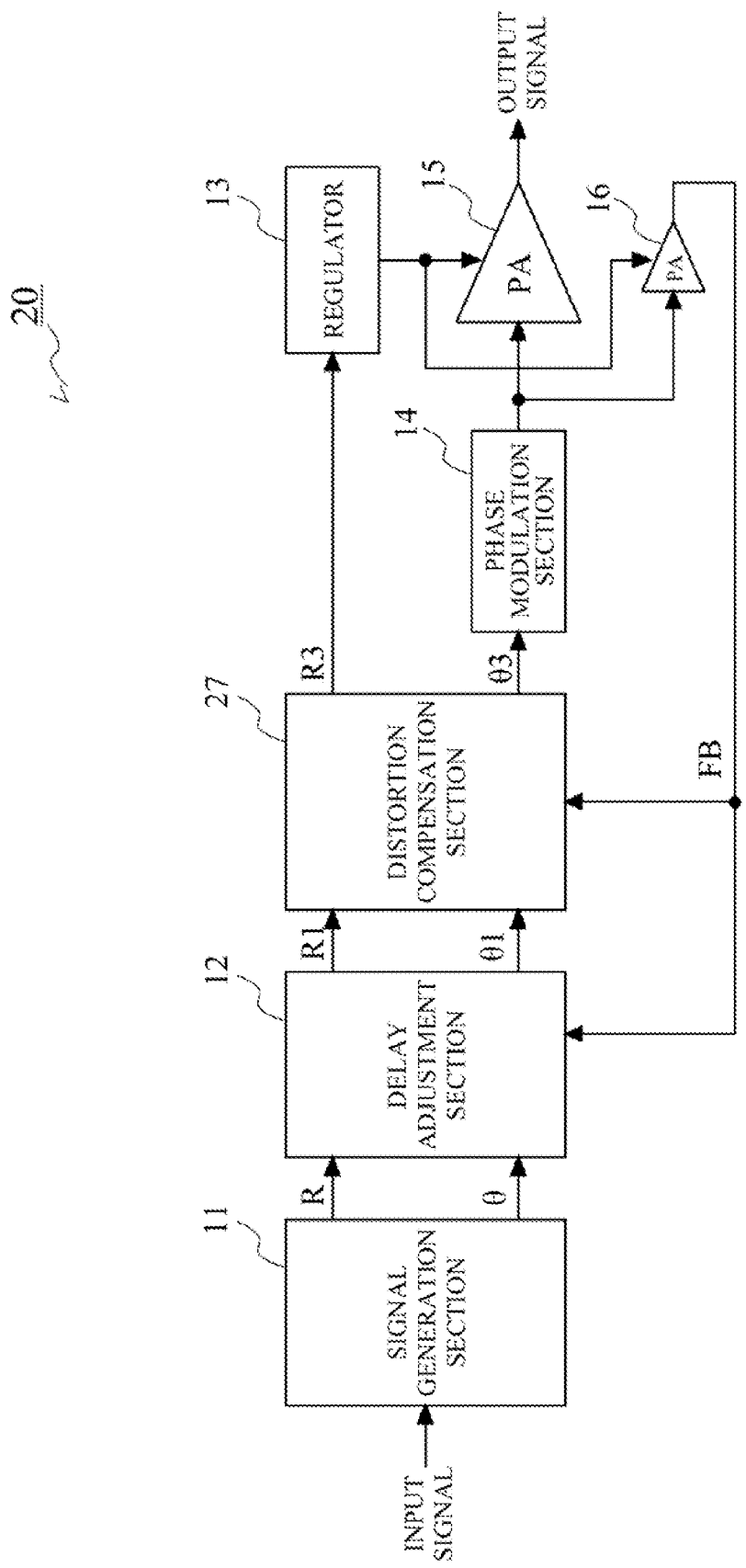
FIG. 3 shows a configuration of a transmission circuit 20 according to a second embodiment of the present invention.

FIG. 3 shows a configuration of the transmission circuit 20 according to the second embodiment of the present invention. In FIG. 3, the transmission circuit 20 of the second embodiment includes the signal generation section 11, the delay adjustment section 12, the regulator 13, the phase modulation section 14, the amplitude modulation section 15, the feedback signal generation section 16, and a distortion compensation section 27. As shown in FIG. 3, the transmission circuit 20 according to the second embodiment has the same configuration as that of the transmission circuit 10 according to the first embodiment except that the distortion compensation section 27 is added. In the following, the components of the transmission circuit 20 which are the same as those of the transmission circuit 10 are denoted by the same reference numerals and descriptions thereof are omitted.

The adjusted amplitude signal R1 and the adjusted phase signal θ1 outputted from the delay adjustment section 12 are inputted to the distortion compensation section 27. Based on the adjusted amplitude signal R1 and the adjusted phase signal θ1 outputted from the delay adjustment section 12 and the feedback signal FB outputted from the feedback signal generation section 16, the distortion compensation section 27 calculates an amount of nonlinear distortion caused in the amplitude modulation section 15. Then, the distortion compensation section 27 controls the outputs of the adjusted amplitude signal R1 and the adjusted phase signal θ1 so that the calculated amount of nonlinear distortion is eliminated, and outputs the resultant signals as a compensated amplitude signal R3 and a compensated phase signal θ3, respectively.

The compensated amplitude signal R3 and the compensated phase signal θ3 outputted from the distortion compensation section 27 are inputted to the regulator 13 and the phase modulation section 14, respectively. The regulator 13 generates a voltage control signal in accordance with the inputted compensated amplitude signal R3 and provides the voltage control signal to the amplitude modulation section 15 and the feedback signal generation section 16. The phase modulation section 14 modulates an oscillation signal generated by an oscillator (not shown) by using the inputted compensated phase signal θ3 to generate a phase modulation signal.

Figure 4:
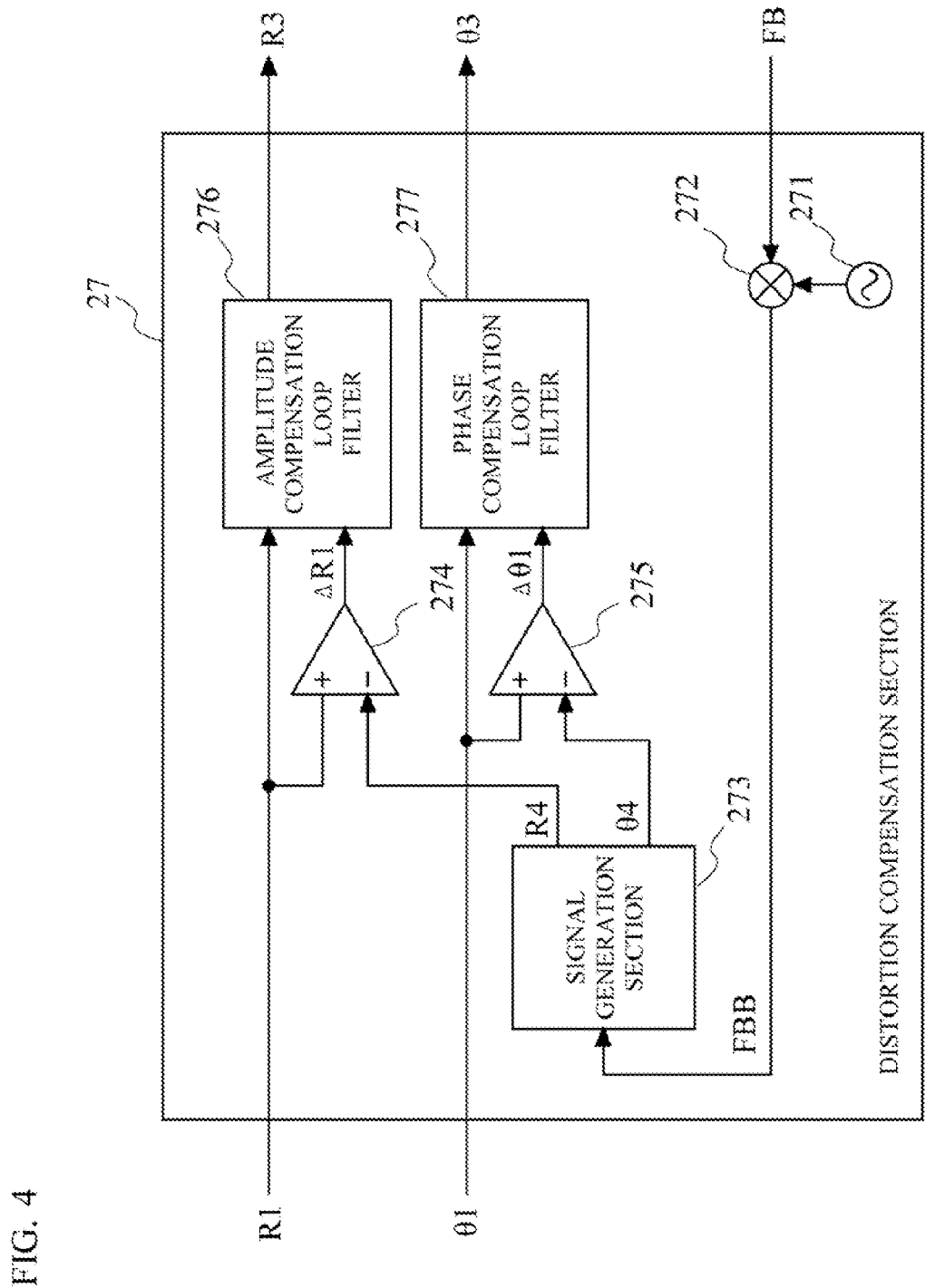
FIG. 4 shows a detailed configuration example of a distortion compensation section 27 of FIG. 3.

FIG. 4 shows a detailed configuration example of the distortion compensation section 27. The distortion compensation section 27 shown in FIG. 4 includes an oscillator 271, a mixer 272, a signal generation section 273, a magnitude comparator 274, a phase comparator 275, an amplitude compensation loop filter 276, and a phase compensation loop filter 277.

The mixer 272 multiplies a carrier frequency signal generated by the oscillator 271 by a feedback signal FB outputted from the feedback signal generation section 16 to generate a feedback baseband signal FBB. The signal generation section 273 processes the feedback baseband signal FBB and thereby generates a feedback amplitude signal R4 and a feedback phase signal θ4. The magnitude comparator 274 compares the adjusted amplitude signal R1 outputted from the delay adjustment section 12 with the feedback amplitude signal R4 generated by the signal generation section 273 and calculates a differential amplitude signal ΔR1 (=R1−R4).

The phase comparator 275 compares the adjusted phase signal θ1 outputted from the delay adjustment section 12 with the feedback phase signal θ4 generated by the signal generation section 273, and calculates a differential phase signal Δθ1 (=θ1−θ4). The amplitude compensation loop filter 276 calculates a compensated amplitude signal R3 for converging the differential amplitude signal ΔR1 to zero and outputs the compensated amplitude signal R3. The phase compensation loop filter 277 calculates a compensated phase signal θ3 for converging the differential phase signal Δθ1 to zero and outputs the compensated phase signal θ3.

As described above, in the transmission circuit 20 according to the second embodiment of the present invention, by using a feedback signal generated by the feedback signal generation section 16 attained by having the same circuit configuration as the amplitude modulation section 15 and a smaller circuit scale, a difference between a signal delay amount in the amplitude path and a signal delay amount in the phase path is adjusted and nonlinear distortion caused in the amplitude modulation section 15 is compensated. Consequently, in addition to the advantageous effect described in the first embodiment, the nonlinear distortion caused in the amplitude modulation section 15 can be compensated with a low power consumption.

It should be noted that it is preferable that the amplitude modulation section 15 and the feedback signal generation section 16 described in the first and the second embodiments are mounted on the same semiconductor substrate so as to be adjacent to each other. By mounting the amplitude modulation section 15 and the feedback signal generation section 16 in such a manner, device properties of the circuit elements used in the amplitude modulation section 15 can match device properties of the circuit elements used in the feedback signal generation section 16. Furthermore, a difference between an output of the amplitude modulation section 15 and an output of the feedback signal generation section 16 can be approximated to zero as closely as possible.

Therefore, a difference between a signal delay mount in the amplitude path and a signal delay amount in the phase path can be calculated and adjusted highly accurately in the delay adjustment section 12. Furthermore, nonlinear distortion caused in the amplitude modulation section 15 can be calculated and compensated highly accurately in the distortion compensation section 27.

Further, in the first and the second embodiments, the signal inputted to the signal generation section 11 may be two signals, which are an in-phase component signal (I signal) and a quadrature component signal (Q signal). The signal generation section 11 may convert the I signal and the Q signal to an amplitude signal R by using an envelope detection method and convert the I signal and the Q signal to a phase signal θ by using a method of phase information extraction by a limiter.

<Communication Apparatus Using Transmission Circuit of the Present Invention>

Figure 5:
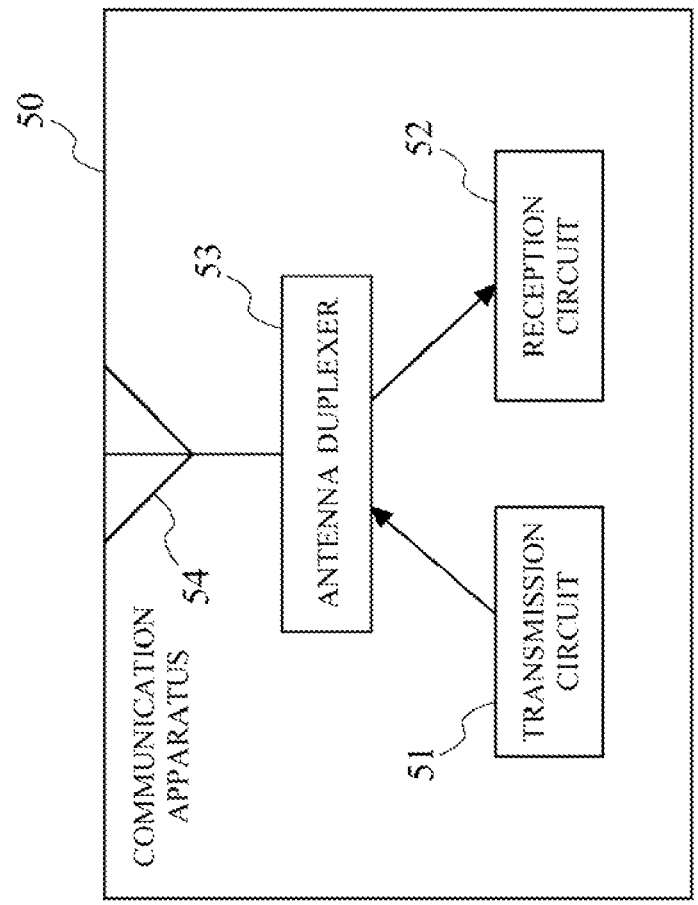
FIG. 5 shows a configuration of a communication apparatus 50 according to one embodiment of the present invention.
Figure 6:
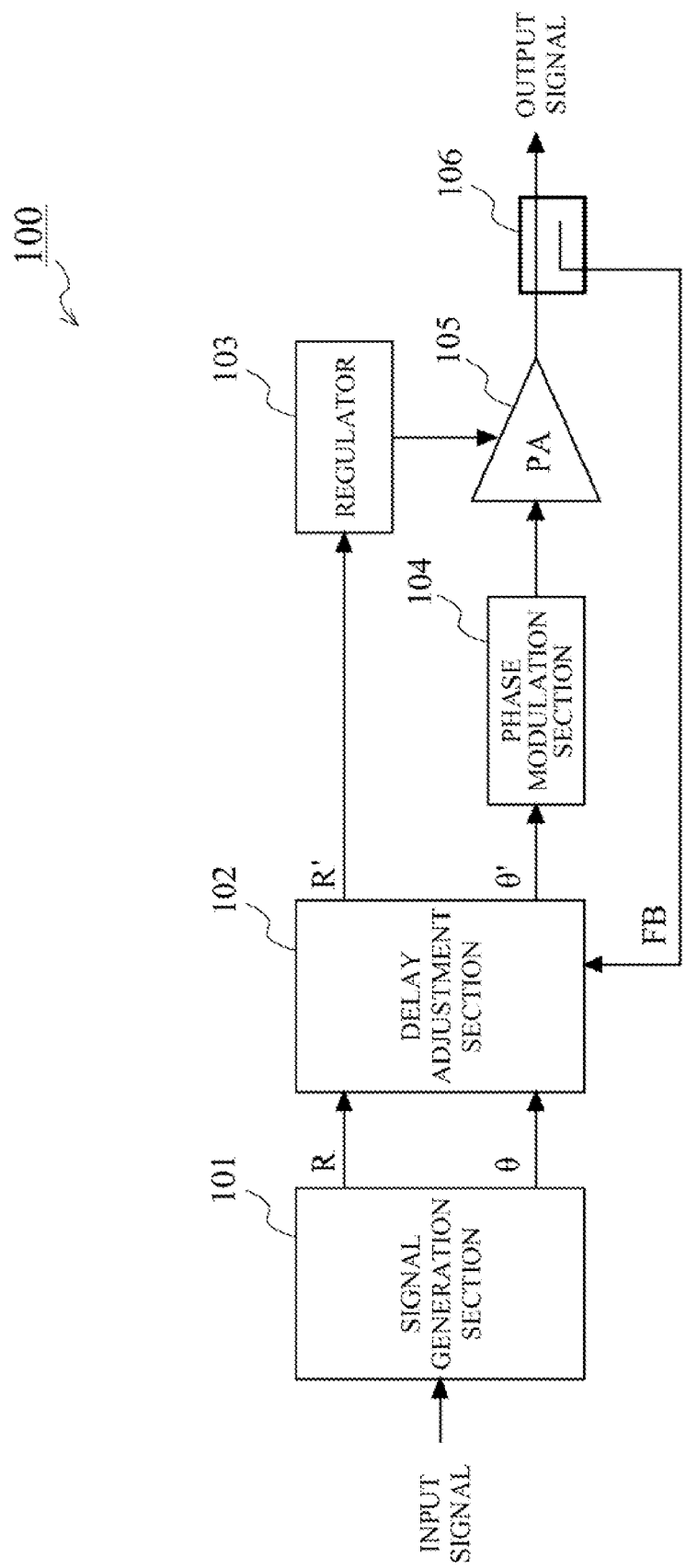
FIG. 6 shows a configuration of a conventional transmission circuit 100.
Figure 7:
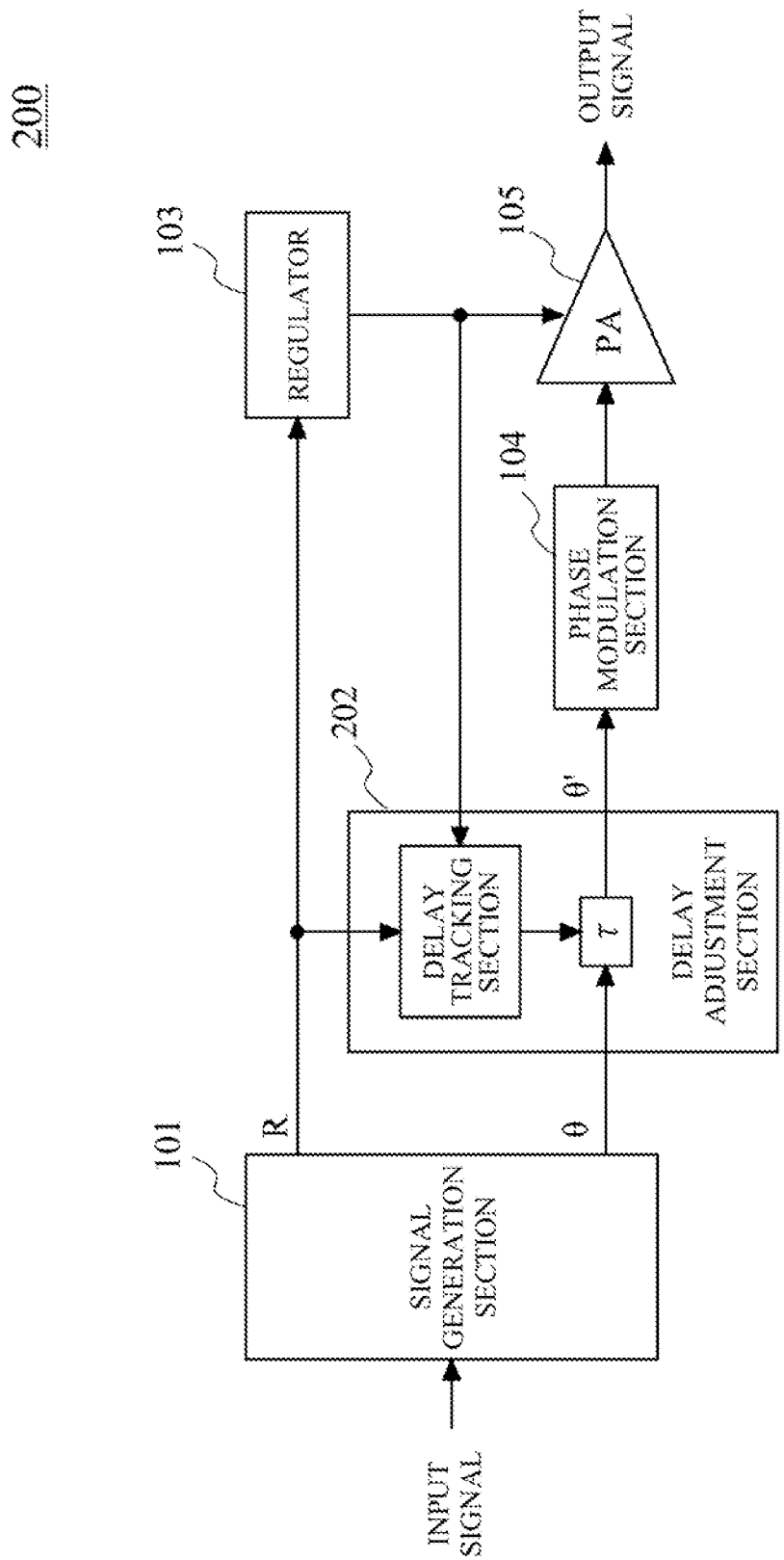
FIG. 7 shows a configuration of another conventional transmission circuit 200.

FIG. 5 shows a configuration example of a communication apparatus 50 according to one embodiment of the present invention. In FIG. 5, the communication apparatus 50 includes a transmission circuit 51, a reception circuit 52, an antenna duplexer 53, and an antenna 54. The transmission circuit 51 corresponds to the transmission circuit 10 according to the first embodiment or the transmission circuit 20 according to the second embodiment. The antenna duplexer 53 transmits a transmission signal outputted from the transmission circuit 51 to the antenna 54 and prevents the transmission signal from leaking into the reception circuit 52. Furthermore, the antenna duplexer 53 transmits a reception signal inputted from the antenna 54 to the reception circuit 52 and prevents the reception signal from leaking into the transmission circuit 51.

Accordingly, the transmission signal is outputted from the transmission circuit 51 and released into an open space from the antenna 54 via the antenna duplexer 53. The reception signal is received by the antenna 54 and then received by the reception circuit 52 via the antenna duplexer 53.

By using the transmission circuit 10 or the transmission circuit 20 described above, the communication apparatus 50 can attain a low distortion wireless device while ensuring linearity of a transmission signal. Furthermore, because the output of the transmission circuit 51 is not branched by a directional coupler and the like, it is possible to reduce loss that is caused between the transmission circuit 51 and the antenna 54, which allows reduction in power consumed at the time of transmission and a prolonged use of the communication apparatus 50 as a wireless communication apparatus. It should be noted that the communication apparatus 50 may include only the transmission circuit 51 and the antenna 54.

The present invention is useful for a transmission circuit which is used in a wireless communication system such as a mobile phone, a wireless LAN, and the like, and particularly useful for, such as suppressing loss in a power amplifier thereby decreasing power consumption in a transmission circuit.

DESCRIPTION OF THE REFERENCE CHARACTERS

10,20,100,200 transmission circuit
11,123,101,273 signal generation section
12,102,202 delay adjustment section
13,103 regulator
14,104 phase modulation section
15,105 amplitude modulation section
16 feedback signal generation section
27 distortion compensation section
50 communication apparatus
51 transmission circuit
52 reception circuit
53 antenna duplexer
54 antenna
106 coupler
121,271 oscillator
122,272 mixer
124,125,274,275 comparator
126,276,277 loop filter
127 delay section

The invention claimed is:

1. A transmission circuit using polar modulation, comprising:
   a signal generation section operable to process an input signal and generate an amplitude signal representing an amplitude component and a phase signal representing a phase component;
   a delay adjustment section operable to calculate a difference between a signal delay amount in an amplitude path and a signal delay amount in a phase path based on the amplitude signal, the phase signal, and a feedback signal and adjust, in accordance with the difference, one or both of the signal delay amount in the amplitude signal and the signal delay amount in the phase signal;
   a phase modulation section operable to modulate a predetermined carrier signal by an adjusted phase signal adjusted by the delay adjustment section and generate a phase modulation signal;
   a regulator operable to output a voltage control signal in accordance with a magnitude of the adjusted amplitude signal adjusted by the delay adjustment section;
   an amplitude modulation section operable to modulate the phase modulation signal by the voltage control signal and output the modulated signal to an antenna as a transmission signal; and
   a feedback signal generation section operable to, by receiving a same phase modulation signal and a same voltage control signal as those received by the amplitude modulation section, modulate the received phase modulation signal by the received voltage control signal and feed back the modulated signal to the delay adjustment section as the feedback signal,
   wherein the feedback signal generation section has a circuit scale which is smaller than a circuit scale of the amplitude modulation section.

2. The transmission circuit according to claim 1, further comprising
   a distortion compensation section operable to calculate an amount of nonlinear distortion caused in the amplitude modulation section based on the adjusted amplitude signal, the adjusted phase signal and the feedback signal and control, in accordance with the amount of nonlinear distortion, output of the adjusted amplitude signal and the adjusted phase signal so as to compensate the nonlinear distortion.

3. The transmission circuit according to claim 1, wherein the amplitude modulation section and the feedback signal generation section are mounted on a same semiconductor substrate so as to be adjacent to each other.

4. The transmission circuit according to claim 2, wherein the amplitude modulation section and the feedback signal generation section are mounted on a same semiconductor substrate so as to be adjacent to each other.

5. A communication apparatus, comprising:
   the transmission circuit according to claim 1, operable to generate a transmission signal; and an antenna operable to output the transmission signal generated by the transmission circuit.

6. The communication apparatus according to claim 5, further comprising:
a reception circuit operable to process a reception signal received from the antenna; and
an antenna duplexer operable to output the transmission signal generated by the transmission circuit to the antenna, and output the reception signal received from the antenna to the reception circuit.

7. The transmission circuit according to claim 1, wherein the feedback signal generation section has a circuit scale which is smaller than one-ninth of the circuit scale of the amplitude modulating section.

8. The transmission circuit according to claim 1, wherein the amplitude modulation section and the feedback signal generation section have a same circuit configuration.

* * * * *